US012622011B2

(12) United States Patent
Hu

(10) Patent No.: US 12,622,011 B2
(45) Date of Patent: May 5, 2026

(54) SEMICONDUCTOR DEVICE WITH DIFFUSION BARRIER LAYER AND METHOD OF FABRICATION THEREFOR

(71) Applicant: NXP USA, Inc., Austin, TX (US)

(72) Inventor: Jie Hu, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 450 days.

(21) Appl. No.: 18/298,815

(22) Filed: Apr. 11, 2023

(65) Prior Publication Data
US 2024/0347628 A1 Oct. 17, 2024

(51) Int. Cl.
H10D 30/47 (2025.01)
H10D 30/01 (2025.01)
H10D 64/00 (2025.01)

(52) U.S. Cl.
CPC ......... H10D 30/475 (2025.01); H10D 30/015 (2025.01); H10D 64/111 (2025.01)

(58) Field of Classification Search
CPC .. H10D 30/475; H10D 30/015; H10D 64/111; H10D 62/149; H10D 62/8503
See application file for complete search history.

(56) References Cited

U.S. PATENT DOCUMENTS

| | | |
|---|---|---|
| 6,939,781 B2 | 9/2005 | Redd et al. |
| 7,812,369 B2 | 10/2010 | Chini et al. |
| 8,283,699 B2 | 10/2012 | Wu |
| 8,404,508 B2 | 3/2013 | Lidow et al. |
| 9,024,324 B2 | 5/2015 | Teplik et al. |
| 9,040,398 B2 | 5/2015 | Saxler et al. |
| 9,741,840 B1 | 8/2017 | Moens et al. |
| 2008/0128752 A1 | 6/2008 | Wu |
| 2015/0060948 A1 | 3/2015 | Kawai et al. |
| 2015/0187685 A1 | 7/2015 | Preuss et al. |
| 2017/0133496 A1 | 5/2017 | Tsai et al. |
| 2018/0342598 A1 | 11/2018 | Tsai et al. |
| 2019/0245080 A1 | 8/2019 | Singh |
| 2020/0176389 A1 | 6/2020 | Huang et al. |
| 2020/0194578 A1 | 6/2020 | Ramaswamy et al. |

(Continued)

OTHER PUBLICATIONS

U.S. Appl. No. 17/450,879 FOA dated Dec. 6, 2024 15 pages.

(Continued)

*Primary Examiner* — Syed I Gheyas
(74) *Attorney, Agent, or Firm* — Sherry W. Gourlay

(57) ABSTRACT

A semiconductor device includes a semiconductor substrate with an upper surface and a channel, a dielectric layer disposed over the upper surface, and a diffusion barrier layer disposed over the dielectric layer. The diffusion barrier layer is patterned to include multiple segments. A gate electrode is formed over the semiconductor substrate and is electrically coupled to the channel. A drain opening is spatially separated from a first side of the gate electrode. A drain electrode, which also is electrically coupled to the channel, includes a first portion formed within the drain opening, and a second portion that overlies a segment of the diffusion barrier layer. A conductive field plate between the gate electrode and the drain electrode includes a field plate layer and another segment of the diffusion barrier layer. The drain electrode and the field plate layer may be formed from portions of a same conductive layer.

21 Claims, 8 Drawing Sheets

(56) References Cited

U.S. PATENT DOCUMENTS

| | | | |
|---|---|---|---|
| 2021/0336043 A1* | 10/2021 | Birner | H01L 21/765 |
| 2022/0085176 A1 | 3/2022 | Shinohara et al. | |
| 2023/0124686 A1 | 4/2023 | Renaud et al. | |
| 2023/0187529 A1 | 6/2023 | Kawashima et al. | |

OTHER PUBLICATIONS

U.S. Appl. No. 17/450,879 Not yet published); 47 pages (filed Oct. 14, 2021).
U.S. Appl. No. 17/450,879 NFOA dated Jul. 9, 2024 12 pages.
U.S. Appl. No. 17/450,879 NFOA dated May 22, 2025; 19 pages.
U.S. Appl. No. 17/450,879, (filed Oct. 14, 2021). Not yet published, 47 pages.

\* cited by examiner

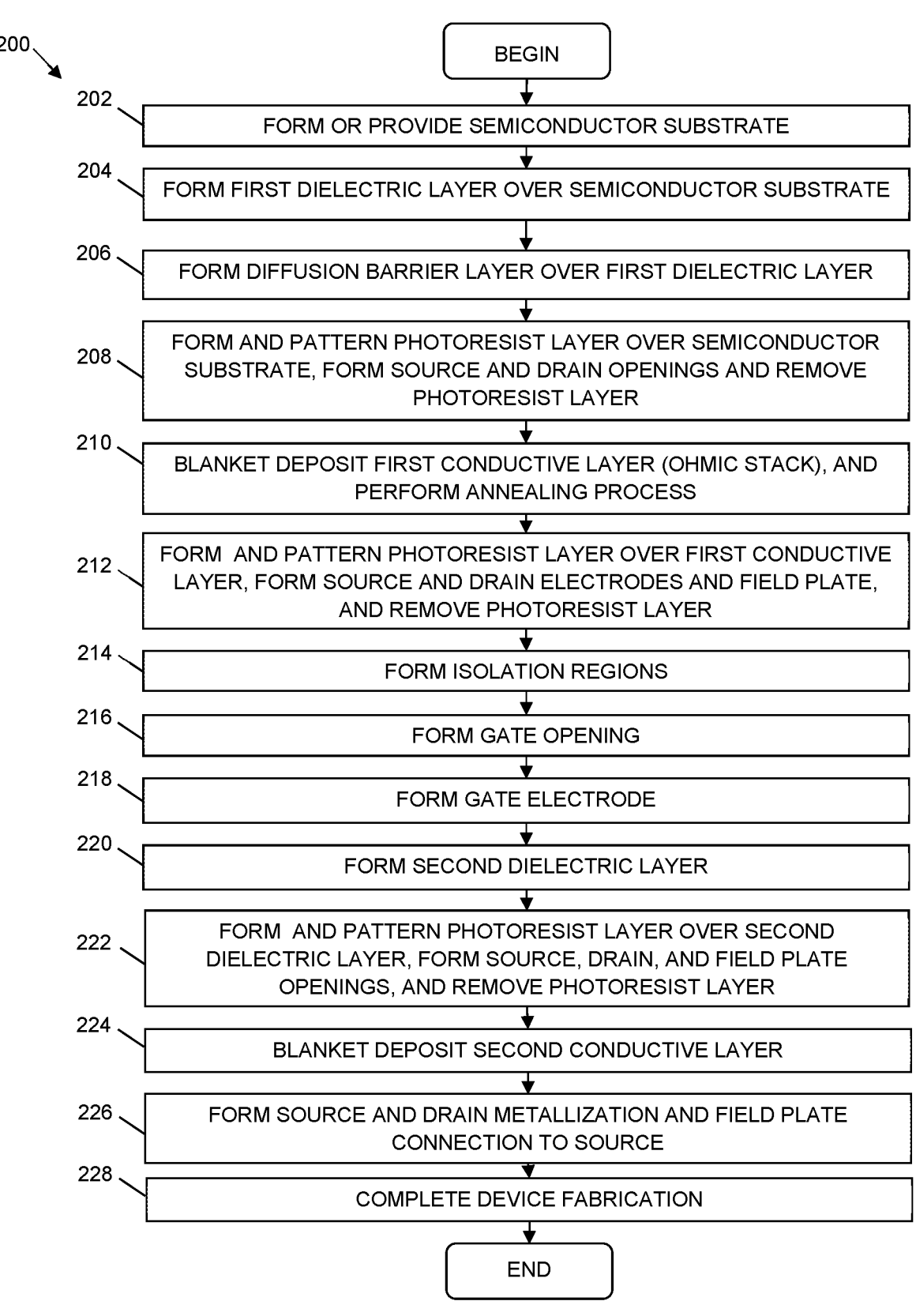

200

BEGIN

202 FORM OR PROVIDE SEMICONDUCTOR SUBSTRATE

204 FORM FIRST DIELECTRIC LAYER OVER SEMICONDUCTOR SUBSTRATE

206 FORM DIFFUSION BARRIER LAYER OVER FIRST DIELECTRIC LAYER

208 FORM AND PATTERN PHOTORESIST LAYER OVER SEMICONDUCTOR SUBSTRATE, FORM SOURCE AND DRAIN OPENINGS AND REMOVE PHOTORESIST LAYER

210 BLANKET DEPOSIT FIRST CONDUCTIVE LAYER (OHMIC STACK), AND PERFORM ANNEALING PROCESS

212 FORM AND PATTERN PHOTORESIST LAYER OVER FIRST CONDUCTIVE LAYER, FORM SOURCE AND DRAIN ELECTRODES AND FIELD PLATE, AND REMOVE PHOTORESIST LAYER

214 FORM ISOLATION REGIONS

216 FORM GATE OPENING

218 FORM GATE ELECTRODE

220 FORM SECOND DIELECTRIC LAYER

222 FORM AND PATTERN PHOTORESIST LAYER OVER SECOND DIELECTRIC LAYER, FORM SOURCE, DRAIN, AND FIELD PLATE OPENINGS, AND REMOVE PHOTORESIST LAYER

224 BLANKET DEPOSIT SECOND CONDUCTIVE LAYER

226 FORM SOURCE AND DRAIN METALLIZATION AND FIELD PLATE CONNECTION TO SOURCE

228 COMPLETE DEVICE FABRICATION

END

FIG. 2

SEMICONDUCTOR DEVICE WITH DIFFUSION BARRIER LAYER AND METHOD OF FABRICATION THEREFOR

TECHNICAL FIELD

Embodiments of the subject matter described herein relate generally to semiconductor devices, and methods for fabricating such devices.

BACKGROUND

Semiconductor devices find application in a wide variety of electronic components and systems. For example, high power, high frequency transistors find application in radio frequency (RF) systems and power electronics systems. Gallium nitride (GaN) device technology is particularly well suited for these RF power and power electronics applications due to its superior electronic and thermal characteristics. In particular, the high electron velocity and high breakdown field strength of GaN make devices fabricated from this material ideal for RF power amplifiers and high-power switching applications.

GaN heterojunction field effect transistors (HFETs) include ohmic source and drain electrodes at opposite ends of a channel, with a gate electrode positioned above the channel between the source and drain electrodes. In addition, some GaN HFETs include a field plate to enhance the performance and reliability of the transistors.

High temperature annealing processes performed during fabrication of some GaN HFETs may result in the source and drain electrodes having rough edges (e.g., due to aluminum spiking that may occur during the process). This phenomenon limits the ability to reliably reduce the source-drain pitch for a design, and also may result in mis-alignment of the field plate to the drain electrode. Ultimately, limitations on reducing source-drain pitch and mis-alignment of the field plate and drain electrode may inhibit development of higher-performing GaN HFET designs. Accordingly, there is a need for semiconductor devices and, in particular, GaN devices with higher-quality source and drain electrodes.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIG. 2 is a process flow diagram for a method for fabricating the transistor of FIG. 1, in accordance with an embodiment.

DETAILED DESCRIPTION

Embodiments of the inventive subject matter described herein include semiconductor devices and methods of their fabrication. More specifically, transistor devices are described herein which include features (e.g., diffusion barrier layer segments) that may enable reduction or elimination of rough edges on source and drain electrodes that may otherwise occur during high temperature annealing processes, if those features are not included. By eliminating such rough edges, the source-drain pitch for a particular transistor design may be reduced. In addition, mis-alignment of a field plate and a drain electrode of a transistor, which may otherwise occur without implementing one or more of the various embodiments disclosed herein, also may be reduced or eliminated. Essentially, transistor embodiments and fabrication methods disclosed herein may enable higher-quality source and drain electrodes, and improved field plate to drain alignment, when compared with many conventional transistors.

Although examples of the various embodiments are described below with respect to gallium nitride (GaN) heterojunction field effect transistor (HFET) devices (e.g., device 100, FIG. 1), it should be noted that the various embodiments may be utilized in other types of transistors, transistors that have semiconductor substrates that do not include GaN (i.e., non-GaN-based transistors), and other types of non-transistor semiconductor devices that include features that benefit from high-quality electrodes and accurate alignment of conductive features. Accordingly, the various embodiments described herein are not limited to GaN HFET devices, but instead include transistors other than HFET transistors, non-GaN-based transistors, and semiconductor devices other than transistors.

Figure 1:
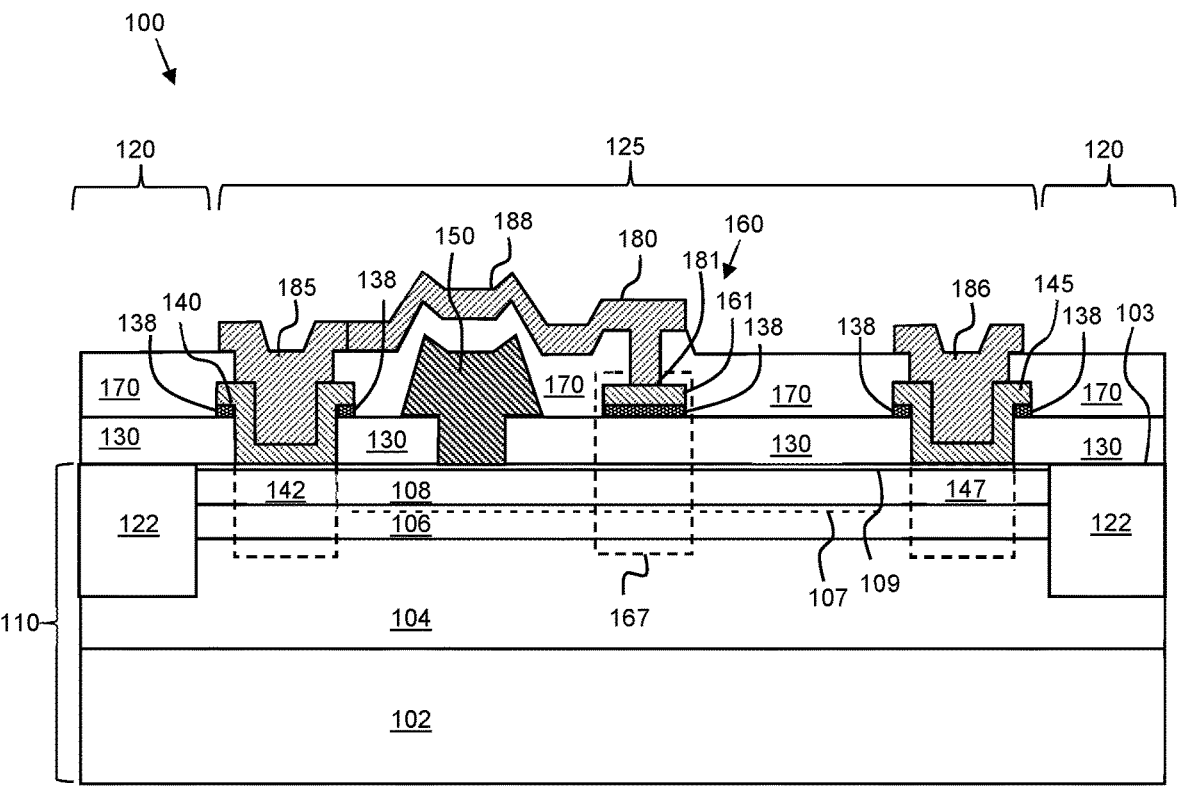
FIG. 1 is a cross-sectional, side view of an exemplary transistor, in accordance with an embodiment.

FIG. 1 is a cross-sectional, side view of an exemplary GaN HFET device 100, in accordance with one or more embodiments. GaN HFET device 100 includes a semiconductor substrate 110, one or more isolation regions 120, an active region 125, a first dielectric layer 130, segments of a diffusion barrier layer 138, a source electrode 140 (i.e., "first current-carrying electrode"), a drain electrode 145 (i.e., "second current-carrying electrode"), a gate electrode 150 (i.e., "control electrode"), a field plate 160, and a second dielectric layer 170. Various additional patterned conductive layers and dielectric layers (not shown) may be formed over dielectric layer 170 to provide for interconnection with bonding pads and other circuit elements.

The semiconductor substrate 110 may include a host substrate 102, a buffer layer 104 disposed on or over the host substrate 102, a channel layer 106 disposed on or over the buffer layer 104, a barrier layer 108 disposed on or over the channel layer 106, and an optional cap layer 109 disposed on or over the channel layer 106. A channel 107 is created in the form of a two-dimensional electron gas (2-DEG) within the channel layer 106 near the interface between the channel layer 106 and barrier layer 108.

In one or more embodiments, the host substrate 102 may include silicon carbide (SIC). In other embodiments, the host substrate 102 may include other materials such as sapphire, silicon (Si), GaN, aluminum nitride (AlN), diamond, poly-SiC, silicon on insulator, gallium arsenide (GaAs), indium phosphide (InP), and other substantially insulating or high resistivity materials. A nucleation layer (not shown) may be formed on an upper surface of the host substrate 102 between the buffer layer 104 and the host substrate 102. In an embodiment, the nucleation layer may include AlN.

Without departing from the scope of the inventive subject matter, it should be appreciated that the choice of materials and arrangement of layers to form the semiconductor substrate 110 is exemplary. It should be appreciated that the inclusion of the host substrate 102, the buffer layer 104, the channel layer 106, the barrier layer 108, and the cap layer 109 into the semiconductor substrate 110 is exemplary and that the function and operation of the various layers may be combined and may change depending on the materials used in any specific embodiment. For example, in some embodiments, the cap layer 109 may be omitted. In other embodiments using N-polar materials, the channel layer 106 may be disposed on or over the barrier layer 108 to create a 2-DEG and channel 107 directly beneath the cap layer 109 and the gate electrode 150. Still further embodiments may include semiconductor layers formed from materials including GaAs, gallium oxide (Ga₂O₃) aluminum gallium arsenide (AlGaAs), indium gallium arsenide (InGaAs), and aluminum indium arsenide (AlInAs) to form the semiconductor substrate 110.

High resistivity regions 122 may be formed in the semiconductor substrate 110 to define isolation regions 120 and an active region 125 above and along the upper surface 103 of the host substrate 102, according to an embodiment.

In various embodiments, a first dielectric layer 130 may be formed on or over the active region 125 and isolation regions 120. Further, a diffusion barrier layer 138 may be formed on or over the first dielectric layer 130. Ultimately, as will be described in detail below, the first dielectric layer 130 and the diffusion barrier layer 138 are patterned so that segments of the diffusion barrier layer 138 (e.g., segments 780-784, FIG. 7) remain only under certain features of device 100 (e.g., under portions of the source electrode 140, the drain electrode 145, and the field plate layer 161). In various embodiments, the diffusion barrier layer 138 may be formed from one or more refractory metals, including one or more materials selected from tungsten (W), molybdenum (Mo), titanium nitride (TiN), or other suitable materials.

As will be discussed in more detail later, the diffusion barrier layer 138 functions to reduce or eliminate rough edges on the below-described source and drain electrodes 140, 145, which otherwise may form during a high temperature annealing process (e.g., during block 210 FIG. 2). Eliminating or substantially reducing rough edges on the source and drain electrodes 140, 145 may enable transistor designs with a reduced source-drain pitch, when compared with conventional designs, and also may avoid mis-alignments of the below-described field plate 160 with respect to the drain electrode 145 due to rough edges on the drain electrode 145 that may otherwise occur using conventional processes.

In various embodiments, the source electrode 140 and the drain electrode 145 are formed over and contact source and drain regions 142, 147 in the active region 125 of semiconductor substrate 110. The source electrode 140 and the drain electrode 145 may be formed inside a source opening and a drain opening (e.g., openings 532, 534, FIG. 5), respectively, which extend through the diffusion barrier layer 138 and through the first dielectric layer 130. More particularly, the source and drain electrodes 140, 145 contact the bottoms and sidewalls of the above-mentioned source and drain openings. In addition, in one or more embodiments, the source and drain openings extend over segments of the diffusion barrier layer 138 and the first dielectric layer 130 on both sides of the source and drain openings. According to one or more embodiments, these overhanging portions of the source and drain electrodes 140, 145 contact the top surfaces of segments of the diffusion barrier layer 138.

Figure 6:
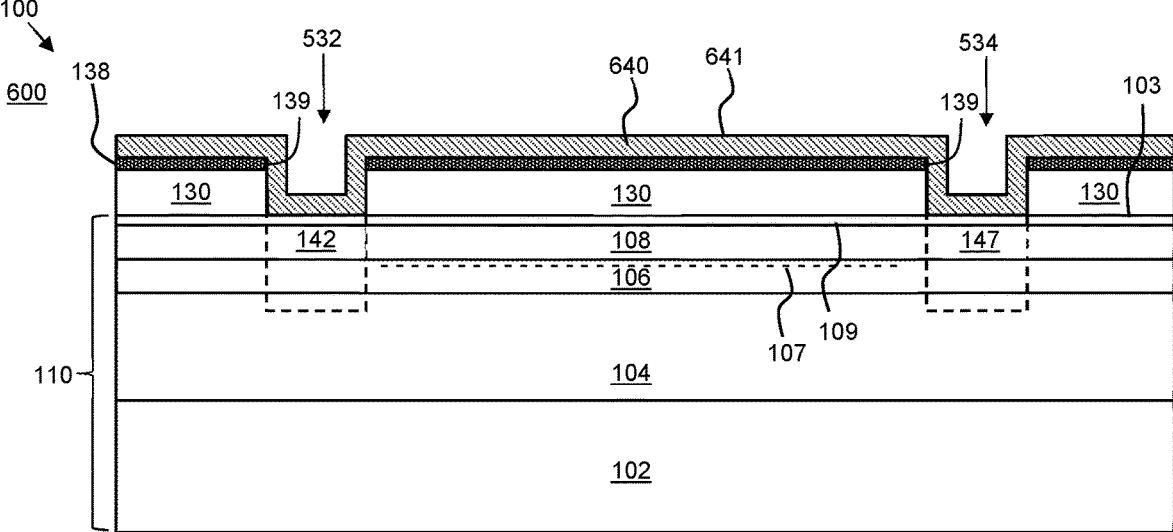

The source and drain electrodes 140, 145 may be formed from portions of a first conductive layer (e.g., layer 640, FIG. 6). The first conductive layer, when annealed, results in the formation of ohmic contacts between the channel 107 and the below-described source and drain regions 142, 147. Accordingly, the first conductive layer may be referred to alternatively as an "ohmic layer" or "ohmic stack."

The bottom extents of the source electrode 140 and the drain electrode 145 overlie and/or contact the semiconductor substrate 110, in various embodiments. For example, in one or more embodiments, the bottom extents of the source electrode 140 and the drain electrode 145 may be formed over and in contact with the cap layer 109. In other embodiments (not shown), one or both of the source electrode 140 and the drain electrode 145 may be recessed through the cap layer 109 and extend partially through the barrier layer 108, or one or both of the source electrode 140 and the drain electrode 145 may be fully recessed through the barrier layer 108 and in contact with the channel layer 104.

The source and drain regions 142, 147 correspond to portions of the semiconductor substrate 110 that underlie the source and drain electrodes 140, 145, respectively. In some embodiments, the source and drain regions 142, 147 may be not intentionally doped (NID) regions of the semiconductor substrate 110. In other embodiments, ion implantation may or diffusion process be used to create intentionally-doped source and drain regions 142, 147.

In an embodiment, the gate electrode 150 is formed on or over the semiconductor substrate 110 in the active region 125. As will be described in more detail in conjunction with FIG. 10, the gate electrode 150 may include a vertical stem (e.g., stem 1052, FIG. 10) and protruding regions (e.g., regions 1054, 1056, FIG. 10). The vertical stem extends from the surface 103 of the substrate 110 to the upper surface of the first dielectric layer 130, and the protruding regions are coupled to the vertical stem and extend over portions of the first dielectric layer 130 toward the source and drain electrodes 140, 145, according to various embodiments. In one or more embodiments, the gate electrode 150 is formed so that the vertical stem is deposited within a gate opening (e.g., opening 920, FIG. 9) through the first dielectric layer 130, and the protruding regions directly contact the upper surface of the first dielectric layer 130 (i.e., no other material layers are intervening). The protruding regions may contact the barrier layer 108 by carefully removing the cap layer 109 and part of the barrier layer 108.

According to various embodiments, the gate electrode 150 may be formed from a metal stack of one or more Schottky materials. Accordingly, the gate electrode 150 may be a low-loss, Schottky gate electrode, according to various embodiments.

The gate electrode 150 is electrically coupled to the channel 107 through the cap layer 109 (if included) and the barrier layer 108. Changes to the electric potential applied to the gate electrode 150 may shift the quasi Fermi level for the barrier layer 108 with respect to the quasi Fermi level for the channel layer 106, thereby modulating the electron concentration in the channel 107 within the semiconductor substrate 110 under the gate electrode 150.

Without departing from the scope of the inventive subject matter, numerous other embodiments of gate electrodes may be realized. The exemplary embodiment of FIG. 1 depicts the gate electrode 150 as T-shaped with a vertical stem and first and second protruding regions and disposed on or over the first dielectric layer 130. In other embodiments (not shown), the gate electrode 150 may be a square shape with no protruding regions. In still other embodiments (not shown), the gate electrode 150 may be recessed through the cap layer 109 and extend partially into the barrier layer 108, increasing the electrical coupling of the gate electrode 150 to the channel 107 through the barrier layer 108. In still other embodiments (not shown), the cap layer 109 may be omitted and the gate electrode 150 may contact the barrier layer 108 directly. In still other embodiments (not shown), the gate electrode 150 may be disposed over a gate dielectric that is formed between the gate electrode 150 and the semiconductor substrate 110 to form a metal-insulator semiconductor field effect transistor (MISFET) device.

Figure 7:
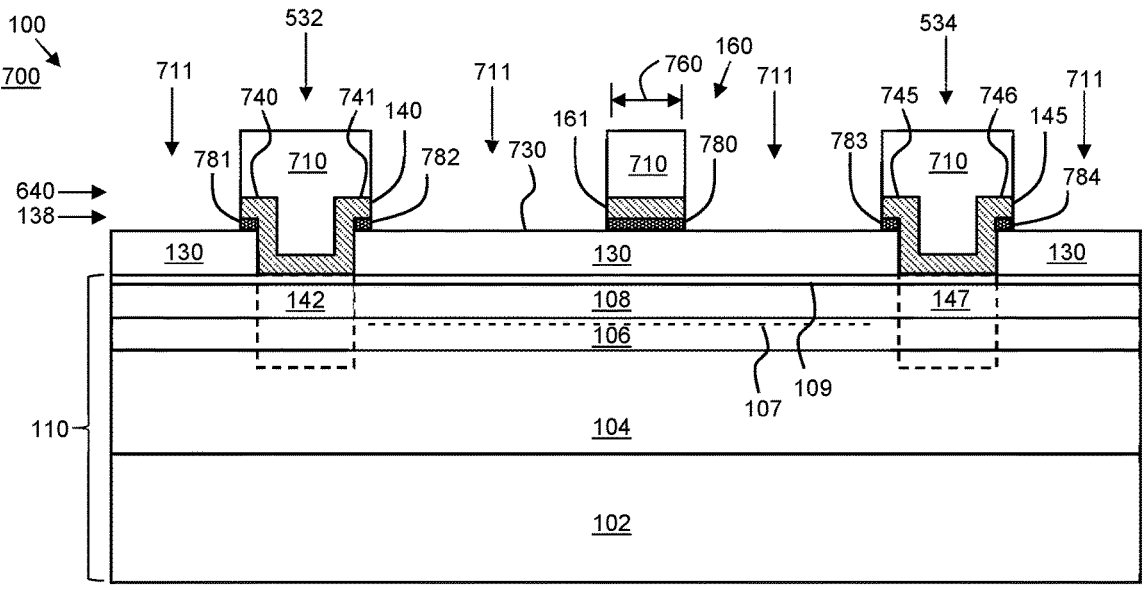

In an embodiment, a field plate 160 is formed from a field plate layer 161 and a segment of the diffusion barrier layer 138 (e.g., segment 780, FIG. 7). The field plate 160 is located adjacent to the gate electrode 150, and between the gate electrode 150 and the drain electrode 145. During operation of device 100, the field plate 160 may function to reduce the electric field at the gate-drain edge, increase the capacitive coupling to the channel 107, and reduce the associated gate-to-drain capacitance between the gate electrode 150 and the drain electrode 145.

In an embodiment, the field plate layer 161 may be formed from a portion of the first conductive layer (e.g., layer 640, FIG. 6), which as described above, is also used to form the source and drain electrodes 140, 145. The field plate 160 may be characterized by a field plate length (e.g., length 760, FIG. 7) and by a field plate-to-gate distance (e.g., distance 1060, FIG. 10), according to an embodiment.

A first metal-insulator-semiconductor region 167 may be created by the field plate 160 (including the field plate layer 161 and the underlying portion of the diffusion barrier layer 138), the underlying first dielectric layer 130, and the semiconductor substrate 110. In an embodiment, the first metal-insulator-semiconductor region 167 may act as part of the active device. The first metal-insulator-semiconductor region 167 has a first threshold voltage, which is dependent on characteristics of the first dielectric layer 130 and the amount of charge in channel 107. In an embodiment, the first threshold voltage may be between about-5 volts and about-15 volts. In other embodiments, the first threshold voltage may be between about-4 volts and about-50 volts.

A second dielectric layer 170 is disposed on or over the first dielectric layer 130, the source and drain electrodes 140 and 145, the gate electrode 150, and the field plate 160. Source metallization 185, drain metallization 186, and a field plate-to-source connection 180 are formed on or over the second dielectric layer 170 from a second conductive layer (e.g., layer 1340, FIG. 13). The second conductive layer extends into source, drain, and field plate openings (e.g., openings 1220-1222, FIG. 12) to contact the source electrode 140, drain electrode 145, and field plate 160, respectively.

In some embodiments, the field plate-to-source connection 180 includes conductive straps 188, which are relatively-thin conductors spaced along the transistor finger, which extend, periodically, over the gate electrode 150 to electrically connect the field plate 160 to the source electrode 140. In other embodiments, connections between the field plate 160 and the source electrode 140 may be accomplished using another metal layer (e.g., an interconnect layer). In still other embodiments, rather than including conductive straps 188, the field plate-to-source connection 180 may include a solid, continuous conductive structure between the field plate 160 and the source electrode 140.

In an embodiment, GaN HFET device 100 may be configured as a transistor finger, in which the source electrode 140, the drain electrode 145, the gate electrode 150, and the field plate 160 may be configured as elongated, parallel elements. For example, in such a transistor finger, a "length" of the gate electrode 150 (i.e., dimension 1057, FIG. 10) is significantly smaller than a "width" of the gate electrode (i.e., a dimension perpendicular to the gate length). In some embodiments, the gate length may be between about 0.2 microns and about 2 microns, although the gate length may be shorter or longer, as well. In some embodiments, the gate width may be between about 4 microns and about 1000 microns, or longer.

Referring now to FIG. 2, flowchart 200 of FIG. 2 depicts an embodiment of a method for fabricating a semiconductor device (e.g., GaN HFET device 100, FIG. 1). FIG. 2 should be viewed alongside FIGS. 3-14, which illustrate cross-sectional, side views of a series of fabrication steps for producing the semiconductor device 100 of FIG. 1, in accordance with one or more example embodiments.

Figure 3:
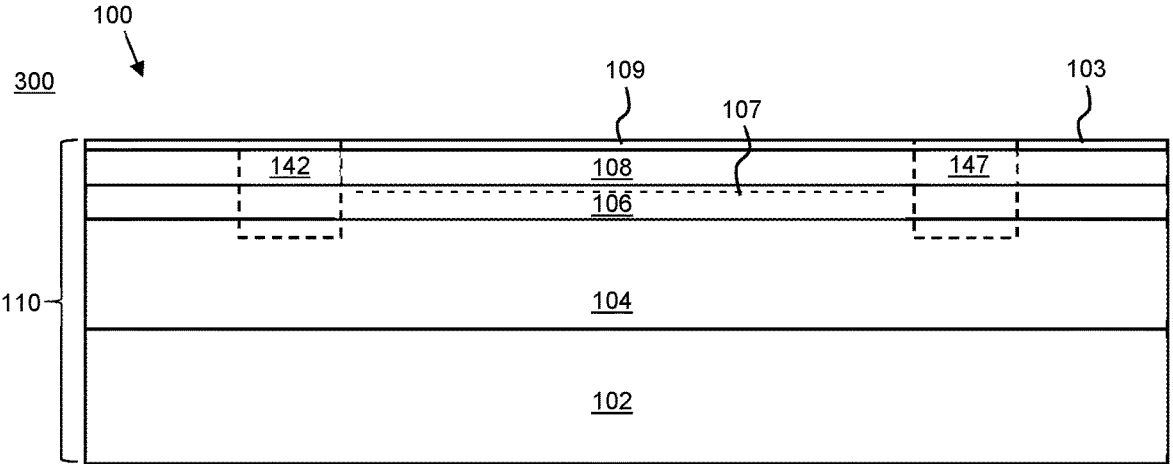
FIGS. 3, 4, 5, 6, 7, 8, 9, 10, 11, 12, 13, and 14 are cross-sectional, side views of partially-formed versions of the transistor of FIG. 1 at various stages of fabrication, in accordance with one or more embodiments.

The method may begin in block 202 of FIG. 2, and as depicted in fabrication stage 300 of FIG. 3, by forming or providing a semiconductor substrate 110. In an embodiment, stage 300 may include providing a host substrate 102, and forming a number of semiconductor layers 104, 106, 108, and 109 (described in detail below) on or over the host substrate 102. The semiconductor layers 104, 106, 108, and 109 may be grown using one of metal-organic chemical vapor deposition (MOCVD), molecular beam epitaxy (MBE), hydride-vapor phase epitaxy (HVPE) or a combination of these techniques, although other suitable techniques may alternatively be used.

As mentioned above, according to one or more embodiments, the host substrate 102 may include silicon carbide (SiC). In other embodiments, the host substrate 102 may include other materials such as sapphire, silicon (Si), GaN, aluminum nitride (AlN), diamond, poly-SiC, silicon on insulator, gallium arsenide (GaAs), indium phosphide (InP), and other substantially insulating or high resistivity materials.

A nucleation layer (not shown) may be formed on an upper surface of the host substrate 102 between the buffer layer 104 and the host substrate 102. In an embodiment, the nucleation layer may include AlN.

The buffer layer 104 may include a number of group III-N semiconductor layers formed on or over the host substrate 102. Each of the semiconductor layers of the buffer layer 104 may include an epitaxially grown group III-nitride epitaxial layer. The group-III nitride epitaxial layers that make up the buffer layer 104 may be nitrogen (N)-face or gallium (Ga)-face material, for example. For example, the buffer layer 104 may include at least one AlGaN mixed crystal layer having a composition denoted by $Al_XGa_{1-X}N$ with an aluminum mole fraction, X, which can take on values between 0 and 1. The total thickness of the buffer layer 104 with all of its layers may be between about 200 angstroms and about 100,000 angstroms although other thicknesses may be used. A limiting X value of 0 yields pure GaN while a value of 1 yields pure aluminum nitride (AlN). Some embodiments may include a buffer layer 104 disposed on or over the host substrate and nucleation layer (not shown).

The buffer layer 104 may include additional $Al_XGa_{1-X}N$ layers. The thickness of the additional $Al_XGa_{1-X}N$ layer(s) may be between about 200 angstroms and about 50,000 angstroms though other thicknesses may be used. In an embodiment, the additional $Al_XGa_{1-X}N$ layers may be configured as GaN (X=0) where the $Al_XGa_{1-X}N$ is not intentionally doped (NID). The additional $Al_XGa_{1-X}N$ layers may also be configured as one or more GaN layers where the one or more GaN layers are intentionally doped with dopants that may include iron (Fe), chromium (Cr), carbon (C) or other suitable dopants that render the buffer layer 104 substantially insulating or high resistivity. The dopant concentration may be between about $-10^{16}$ cm$^{-3}$ and $10^{19}$ cm$^{-3}$ though other higher or lower concentrations may be used. The additional $Al_XGa_{1-X}N$ layers may be configured with X=0.01 to 0.10 where the $Al_XGa_{1-X}N$ is NID or, alternatively, where the $Al_XGa_{1-X}N$ is intentionally doped with Fe, Cr, C, or other suitable dopant species. In other embodiments (not shown), the additional layers may be configured as a superlattice where the additional layers include a series of alternating NID or doped $Al_XGa_{1-X}N$ layers where the value of X takes a value between 0 and 1. In still other embodiments, the buffer layer 104 may also include one or more indium gallium nitride (InGaN) layers, with composition denoted $In_YGa_{1-Y}N$, where Y, the indium mole fraction, may take a value between 0 and 1. The thickness of the InGaN layer(s) may be between about 50 angstroms and about 2000 angstroms, though other thicknesses may be used.

In other embodiments, the semiconductor layers of the buffer layer 104 may not be epitaxially grown. In still other embodiments, the semiconductor layers of the buffer layer 104 may include Si, GaAs, InP, or other suitable materials.

In an embodiment, a channel layer 106 may be formed on or over the buffer layer 104. The channel layer 106 may include one or more group III-N semiconductor layers. The channel layer 106 may include an $Al_XGa_{1-X}N$ layer where X takes on values between 0 and 1. In an embodiment, the channel layer 106 is configured as GaN (X=0) although other values of X may be used without departing from the scope of the inventive subject matter. The thickness of the channel layer 106 may be between about 50 angstroms and about 10,000 angstroms though other thicknesses may be used. The channel layer 106 may be NID or, alternatively, may include Si, germanium (Ge), C, Fe, Cr, or other suitable dopants. The dopant concentration may be between about $10^{15}$ $cm^{-3}$ and about $10^{19}$ $cm^{-3}$ though other higher or lower concentrations may be used. In other embodiments, the channel layer 106 may include NID or doped $In_YGa_{1-Y}N$, where Y, the indium mole fraction, may take a value between 0 and 1.

In an embodiment, a barrier layer 108 may be formed on or over the channel layer 106. The barrier layer 108 may include one or more group III-N semiconductor layers. In some embodiments, the barrier layer 108 has a larger bandgap and larger spontaneous polarization than the channel layer 106 and, when the barrier layer 108 is in direct contact with the channel layer 106, a channel 107 is created in the form of a two-dimensional electron gas (2-DEG) within the channel layer 106 near the interface between the channel layer 106 and barrier layer 108. In addition, strain between the barrier layer 108 and channel layer 106 may cause additional piezoelectric charge to be generated and lead to the formation of the 2-DEG and channel 107. The barrier layer 108 may include at least one NID $Al_XGa_{1-X}N$ layer where X takes on values between 0 and 1. In some embodiments, X may take a value of 0.1 to 0.35, although other values of X may be used. The thickness of the barrier layer 108 may be between about 50 angstroms and about 1000 angstroms though other thicknesses may be used. The barrier layer 108 may be NID or, alternatively, may include Si, Ge, C, Fe, Cr, or other suitable dopants. The dopant concentration may be between about $10^{16}$ $cm^{-3}$ and $10^{19}$ $cm^{-3}$ though other higher or lower concentrations may be used.

In an embodiment, an additional AlN interbarrier layer (not shown) may be formed between the channel layer 106 and the barrier layer 108, according to an embodiment. The AlN interbarrier layer may increase the channel charge and improve the electron confinement of the resultant 2-DEG, while also increasing the charge mobility.

In other embodiments, the barrier layer 108 may include indium aluminum nitride (InAlN) layers, denoted $In_YAl_{1-Y}N$, where Y, the indium mole fraction, may take a value between about 0.1 and about 0.2 though other values of Y may be used. In the case of an InAlN barrier, the thickness of the barrier layer 108 may be between about 30 angstroms and about 1000 angstroms though other thicknesses may be used. In the case of using InAlN to form the barrier layer 108, the InAlN may be NID or, alternatively, may include Si, Ge, C, Fe, Cr, or other suitable dopants. The dopant concentration may be between about $10^{16}$ $cm^{-3}$ and about $10^{19}$ $cm^{-3}$ though other higher or lower concentrations may be used.

In one or more embodiments, a cap layer 109 may be formed on or over the barrier layer 108. The cap layer 109 may present a stable surface for the semiconductor substrate 110 and may protect the surface of the semiconductor substrate 110 from chemical and environmental exposure incident to wafer processing. The cap layer 109 may include one or more group III-N semiconductor layers. In an embodiment, the cap layer 109 is GaN. The thickness of the cap layer 109 may be between about 5 angstroms and about 100 angstroms though other thicknesses may be used. The cap layer 109 may be NID or, alternatively, may include Si, Ge, C, Fe, Cr, or other suitable dopants. The dopant concentration may be between about $10^{16}$ $cm^{-3}$ and $10^{19}$ $cm^{-3}$ though other higher or lower concentrations may be used.

In some embodiments, intentionally-doped source and drain regions 142, 147 may be formed through the upper surface 103 of the semiconductor substrate 110 during stage 300 or later (e.g., during stage 500, FIG. 5). For example, an implant mask (not shown) may be formed on the upper surface 103 of the semiconductor substrate 110, and openings may be formed in the mask to expose areas of the upper surface 103 where the source and drain regions 142, 147 are to be formed. An ion implantation process may then be performed to implant dopant species into the exposed areas, thus producing doped source and drain regions 142, 147. In various embodiments, Si, Ge, O, or another suitable n-type dopant may be implanted into the semiconductor substrate 110 through the implant mask. According to an embodiment, the dopant species may be activated by annealing the semiconductor substrate 110 using an activation annealing process. Alternatively, as discussed previously, the source and drain regions 142, 147 may be NID regions of the semiconductor substrate 110.

Figure 4:
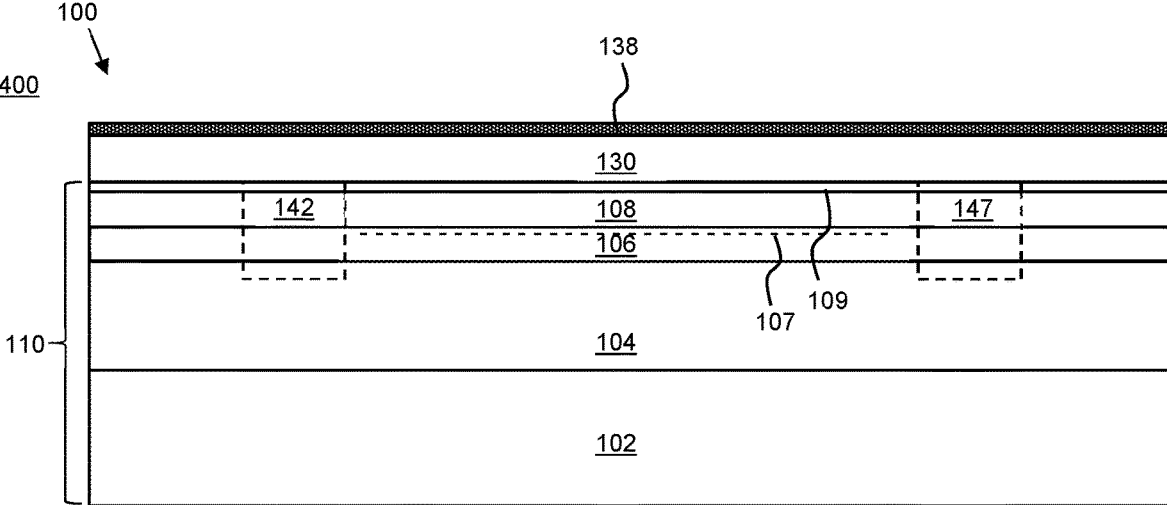

In block 204 of FIG. 2, and as depicted in fabrication stage 400 of FIG. 4, the method may continue by forming a first dielectric layer 130 on or over the upper surface 103 of the semiconductor substrate 110. The first dielectric layer 130 may be formed using one or more processes selected from low pressure chemical vapor deposition (LPCVD), atomic layer deposition (ALD), sputtering, physical vapor deposition (PVD), MBE, chemical vapor deposition (CVD) (including plasma-enhanced (PE) CVD, MOCVD, catalytic CVD, hot wire (HW) CVD, inductively coupled plasma (ICP) CVD, and electron-cyclotron resonance (ECR) CVD), a combination of these or other suitable dielectric deposition technique(s).

The first dielectric layer 130 may be formed from one or more suitable dielectric materials including silicon dioxide ($SiO_2$), silicon nitride (SiN), silicon oxynitride (SiON), aluminum oxide ($Al_2O_3$), aluminum nitride (AlN), and hafnium oxide ($HfO_2$), though other substantially insulating materials may be used. The first dielectric layer 130 may have a thickness of between 200 angstroms and 1000 angstroms. In other embodiments, the first dielectric layer 130 may have a thickness of between 50 angstroms and 10,000 angstroms, though other thicknesses may be used.

In block 206 of FIG. 2, and as also depicted in fabrication stage 400 of FIG. 4, the method may continue by forming a diffusion barrier layer 138 on or over the first dielectric layer 130. In one or more embodiments, the diffusion barrier layer 138 may be formed using one or more processes selected from evaporation, sputtering, PVD, or other suitable deposition techniques.

As mentioned previously, in various embodiments, the diffusion barrier layer 138 may be formed from one or more refractory metals, including one or more materials selected from W, Mo, TiN, or other suitable materials. In various embodiments, the diffusion barrier layer 138 may have a thickness of between about 10 angstroms and 10,000 angstroms, although the diffusion barrier layer 138 may be thinner or thicker, as well.

Figure 5:
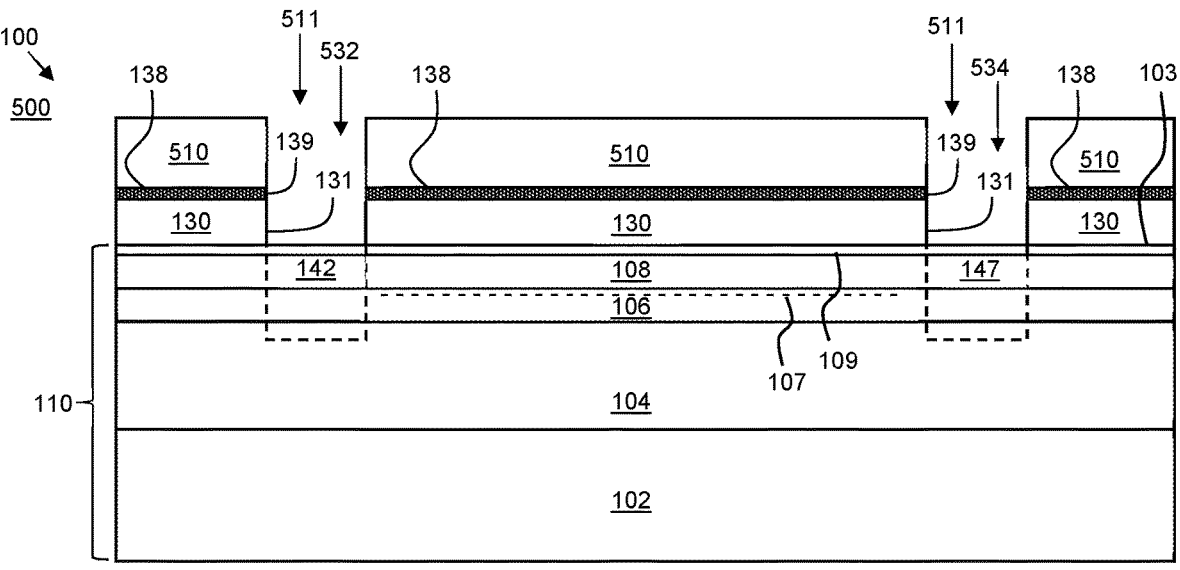

In block 208 of FIG. 2, and as depicted in fabrication stage 500 of FIG. 5, the method may continue by forming and patterning a photoresist layer 510 over the semiconductor substrate 110 (and more particularly on or over the diffusion barrier layer 138). More specifically, once dispensed, the photoresist layer 510 is patterned to form resist openings 511 over the source and drain regions 142, 147.

In an embodiment, source and drain openings 532, 534 then may be created by etching through the diffusion barrier layer 138 and through the first dielectric layer 130 in areas exposed by the resist openings 511, while stopping at the upper surface 103 of the base substrate 110. Etching the diffusion barrier layer 138 and the first dielectric layer 130 preferably includes performing one or more dry etching processes, such as reactive ion etching (RIE), ICP etching, ECR etching, or another suitable dry etching process. In alternate embodiments, a suitable wet chemical etching process alternatively may be performed.

According to one or more embodiments, the materials for the diffusion barrier layer 138 and the first dielectric layer 130 may be selected so that a single dry etch chemistry may be used to sequentially etch both layers 138, 130. For example, when the diffusion barrier layer 138 is formed from tungsten (W), and the first dielectric layer 130 is formed from silicon nitride (SiN), a same etch chemistry (e.g., SF6-O2 or SF6-Ar, or SF6-N2) may be used to etch through both material layers 138, 130. In other embodiments, and particularly when a single etch chemistry is not suitable to etch through the materials of both the diffusion barrier layer 138 and the first dielectric layer 130, multiple etch chemistries and processes may be used first to etch through the diffusion barrier layer 138 and subsequently to etch through the first dielectric layer 130. According to one or more embodiments, suitable dry etching techniques may use one or more of sulphur hexafluoride ($SF_6$), di-carbon hexafluoride ($C_2F_6$), carbon tetrafluoride ($CF_4$), tri-fluoromethane ($CHF_3$) or other chemistries.

Upon completion of the etching process(es), within the source and drain openings 532, 534, sidewalls 131 of the first dielectric layer 130 and adjacent sidewalls 139 of the diffusion barrier layer 138 within each of the source and drain openings 532, 534 may be substantially coplanar. The patterned photoresist layer 510 is removed before proceeding to the next fabrication stage.

In block 210 of FIG. 2, and as depicted in fabrication stage 600 of FIG. 6, the method may continue by depositing a first conductive layer 640 (e.g., an "ohmic layer" or "ohmic stack") on or over the diffusion barrier layer 138 and within the source and drain openings 532, 534. According to an embodiment, the first conductive layer 640 is blanket deposited over the upper surface of the diffusion barrier layer 138, over exposed portions of the upper surface 103 of the semiconductor substrate 110 above the source and drain regions 142, 147, and over sidewalls 131, 139 of the diffusion barrier layer 138 and the first dielectric layer 130 that are exposed within the source and drain openings 532, 534. In one or more embodiments, the constituent layers of the first conductive layer 640 may be deposited by sputtering. In other embodiments, the constituent layer(s) of the first conductive layer 640 may be deposited by evaporation, PVD, or other suitable deposition techniques.

In one or more embodiments, the first conductive layer 640 may contain one or more conductive layers that include titanium (Ti), Al, titanium nitride (TiN), gold (Au), molybdenum (Mo), nickel (Ni), Si, Ge, platinum (Pt), tantalum (Ta), and/or other suitable materials. In other embodiments, the conductive layer(s) of the first conductive layer may include titanium-tungsten (TiW), titanium-aluminum (TiAl), or titanium-tungsten nitride (TiWN).

In one or more specific embodiments, the first conductive layer 640 may include a stack deposited on the substrate that includes Ti, Al, and titanium nitride (TiN). For example, to form the first conductive layer 640, a Ti layer may be blanket disposed on or over the semiconductor substrate 110 in the openings 532, 534, on the sidewalls of openings 532, 534 (i.e., sidewalls 131 of the first dielectric layer 130 and sidewalls 139 of the diffusion barrier layer 138), and across the upper surface of the diffusion barrier layer 138. An Al layer may be disposed on or over the Ti layer, and a TiN layer may be disposed on or over the Al layer. For example, the Ti layer may be between about 10 angstroms and about 200 angstroms thick, the Al layer may be between about 100 angstroms and about 1500 angstroms thick, and the TiN layer may be between about 200 angstroms and about 2000 angstroms thick, although other thicknesses alternatively may be used. In other embodiments, other metals may be substituted for or placed additionally below or on top of the constituent layers of the first conductive layer 640 (e.g., Mo, or Pt may be substituted for TiN, or Ta may be used in addition to Ti, above or below Ti, or substituted for Ti).

In any event, the material selected for the lowest layer of the first conductive layer 640 may be different from the material from which the diffusion barrier layer 138 is formed, in some embodiments. In addition, as is evident in FIG. 6, the first conductive layer 640 is deposited so that it contacts both the upper surface of and the exposed sidewalls 139 of the diffusion barrier layer 138.

After depositing the constituent layers of the first conductive layer 640, an annealing process is performed to alloy the first conductive layer 640, resulting in ohmic contacts to the source and drain regions 142 and 147 of the semiconductor substrate 110 (i.e., to the 2-DEG of the channel 107). More particularly, the ohmic contacts comprise portions of the first conductive layer 640 that contact the upper surface 103 of the semiconductor substrate 110 in the source and drain openings 532, 534. In an embodiment, the annealing step may be accomplished by rapid thermal annealing. In an embodiment, the first conductive layer 640 may be alloyed at a temperature of between about 400 degrees Celsius and about 700 degrees Celsius for between about 15 seconds and about 60 seconds. In other embodiments the first conductive layer 640 may be annealed at between about 300 degrees Celsius and about 900 degrees Celsius for between about 10 seconds and about 600 seconds, though other higher or lower temperatures and/or times may be used. In at least one embodiment, the first conductive layer 640 is annealed at a temperature that is above the temperature at which aluminum spiking otherwise may occur (e.g., above about 600 degrees Celsius). Ultimately, as will be described below, the annealed metal stack used to form the first conductive layer 640 will be patterned to form the source and drain electrodes 140 and 145 and the conductive field plate 160.

As mentioned previously, the diffusion barrier layer 138 functions to reduce or eliminate surface roughness along the upper surface 641 of the first conductive layer 640 during the annealing process, in comparison with the surface roughness of the first conductive layer 640 in conventional devices that do not include the diffusion barrier layer 138. More specifically, the diffusion barrier layer 138 functions to reduce or eliminate aluminum spiking that may otherwise occur during the high-temperature annealing process due in part to the lower melting temperature of aluminum in comparison with the annealing process temperature. This ultimately may result in a reduction or elimination of rough edges on the below-described source and drain electrodes 140, 145, in comparison with conventional devices, which otherwise may degrade the breakdown strength of the first dielectric layer 130.

Essentially, without the diffusion barrier layer 138 of the various embodiments, the surface of the first conductive layer 641 otherwise may become undesirably rough during the annealing process, which in turn may result in rough edges on the source and drain electrodes. As discussed previously, eliminating or substantially reducing rough edges on the source and drain electrodes (e.g., source and drain electrodes 140, 145) by including the diffusion barrier layer 138 may enable transistor designs with a reduced source-drain pitch, when compared with conventional designs, and also may avoid mis-alignments of the below-described field plate 160 with respect to the drain electrode 145 due to rough edges on the drain electrode 145 that may otherwise occur using conventional structures and processes.

In block 212 of FIG. 2, and as depicted in fabrication stage 700 of FIG. 7, the method may continue by forming and patterning a photoresist layer 710 over the first conductive layer 640. More specifically, once dispensed, the photoresist layer 710 is patterned to form resist openings 711 over portions of the first conductive layer 640 and the diffusion barrier layer 138 outside of the desired locations of the source and drain electrodes 140, 145 and field plate 160. Said another way, the photoresist layer 710 is patterned to protect portions of the first conductive layer 640 and the underlying diffusion barrier layer 138 within and on either side of the source and drain openings 532, 534. In addition, the photoresist layer 710 is patterned to protect a portions of the first conductive layer 640 and the underlying diffusion barrier layer 138 at the desired location of the to-be-formed field plate 160.

Portions of layers the first conductive layer 640 and the diffusion barrier layer 138 that are exposed through openings 711 in the photoresist layer 710 are then removed by etching through the first conductive layer 640 and the diffusion barrier layer 138 in areas exposed by the resist openings 711, while stopping at the upper surface 730 of the first dielectric layer 130. Etching the first conductive layer 640 and the diffusion barrier layer 138 preferably includes performing a well-controlled dry etching process, such as RIE, ICP etching, ECR etching, or other suitable dry etching processes. In an alternate embodiment, a suitable wet chemical etching process may be performed.

According to one or more embodiments, the materials for the first conductive layer 640 and the diffusion barrier layer 138 may be selected so that a single etch chemistry may be used to sequentially etch both layers 640, 138. For example, a same etch chemistry (e.g., BCl3/Cl2 chemistry) may be used to etch through both material layers 640, 138. In other embodiments, and particularly when a single etch chemistry is not suitable to etch through the materials of both the first conductive layer 640 and the diffusion barrier layer 138, multiple etch chemistries and processes may be used first to etch through the first conductive layer 640 and subsequently to etch through the diffusion barrier layer 138. For example, suitable dry etching techniques may use one or more of $SF_6$, $C_2F_6$, $CF_4$, $CHF_3$ or other chemistries, according to an embodiment.

The etching process results in the formation of the source and drain electrodes 140, 145 and the conductive field plate 160, each formed from a portion of the first conductive layer 640, and each having one or more underlying portions of the diffusion barrier layer 138. By forming the source and drain electrodes 140, 145 and the conductive field plate 160 using a single patterned photoresist layer 710, the source and drain electrodes 140, 145 and the field plate 160 are inherently self-aligned with each other. As described in more detail below, upon completion of the etching process, the field plate 160 includes segment 780 of the diffusion barrier layer 138 and overlying field plate layer 161 (e.g., a portion of layer 640). In addition, segments 781-784 of the diffusion barrier layer 138 remain under overhanging portions 740, 741, 745, 746 of the source and drain electrodes 140, 145.

The conductive field plate 160 is located between the source and drain electrodes 140, 145. More specifically, according to one or more embodiments, the conductive field plate 160, once formed, has a field plate width 760 in a range of about 0.1 microns to about 4 microns (e.g., between about 0.2 microns and about 2 microns), although the field plate width 760 may be narrower or wider, in other embodiments. As shown in FIG. 7, the field plate 160 includes a first segment 780 of the diffusion barrier layer 138, which remains underneath the overlying field plate layer 161, and the first segment 780 extends across substantially the entire width 760 of the field plate 160. Essentially, the first segment 780 and the field plate layer 161 have the same planform shape. A first sidewall (e.g., a left sidewall in FIG. 7) of the first segment 780 is substantially coplanar with a first sidewall (e.g., a left sidewall in FIG. 7) of the field plate layer 161, and a second sidewall (e.g., a right sidewall in FIG. 7) of the first segment 780 is substantially coplanar with a second sidewall (e.g., a right sidewall in FIG. 7) of the field plate layer 161.

According to one or more embodiments, once formed, the source electrode 140 includes a first contact portion within the source opening 532 and first and second overhanging portions 740, 741 on either side of the source opening 532, where the overhanging portions 740, 741 overlie the upper surface 730 of the first dielectric layer 130. According to one or more embodiments, second and third segments 781, 782 of the diffusion barrier layer 138 remain underneath the first and second overhanging portions 740, 741, respectively, of the source electrode 140. The second and third segments 781, 782 extend the entire lengths (i.e., dimension into the page, in FIG. 7) of the first and second overhanging portions 740, 741. An exposed sidewall of the second segment 781 is substantially coplanar with a first sidewall (e.g., a left sidewall in FIG. 7) of the source electrode 140 (i.e., a sidewall of the overhanging portion 740). An exposed sidewall of the third segment 782 is substantially coplanar with a second sidewall (e.g., a right sidewall in FIG. 7) of the source electrode 140 (i.e., a sidewall of the overhanging portion 741).

Similarly, once formed, the drain electrode 145 includes a first contact portion within the drain opening 534 and first and second overhanging portions 745, 746 on either side of the drain opening 534, where the overhanging portions 745, 746 also overlie the upper surface 730 of the first dielectric layer 130. According to one or more embodiments, fourth and fifth segments 783, 784 of the diffusion barrier layer 138 remain underneath the first and second overhanging portions 745, 746, respectively, of the drain electrode 145. The fourth and fifth segments 783, 784 extend the entire lengths (i.e., dimension into the page, in FIG. 7) of the first and second overhanging portions 745, 746. An exposed sidewall of the fourth segment 783 is substantially coplanar with a first sidewall (e.g., a left sidewall in FIG. 7) of the drain electrode 145 (i.e., a sidewall of the overhanging portion 745). An exposed sidewall of the fifth segment 784 is substantially coplanar with a second sidewall (e.g., a right sidewall in FIG. 7) of the drain electrode 145 (i.e., a sidewall of the overhanging portion 746). The patterned photoresist layer 710 is removed before proceeding to the next fabrication stage.

Figure 8:
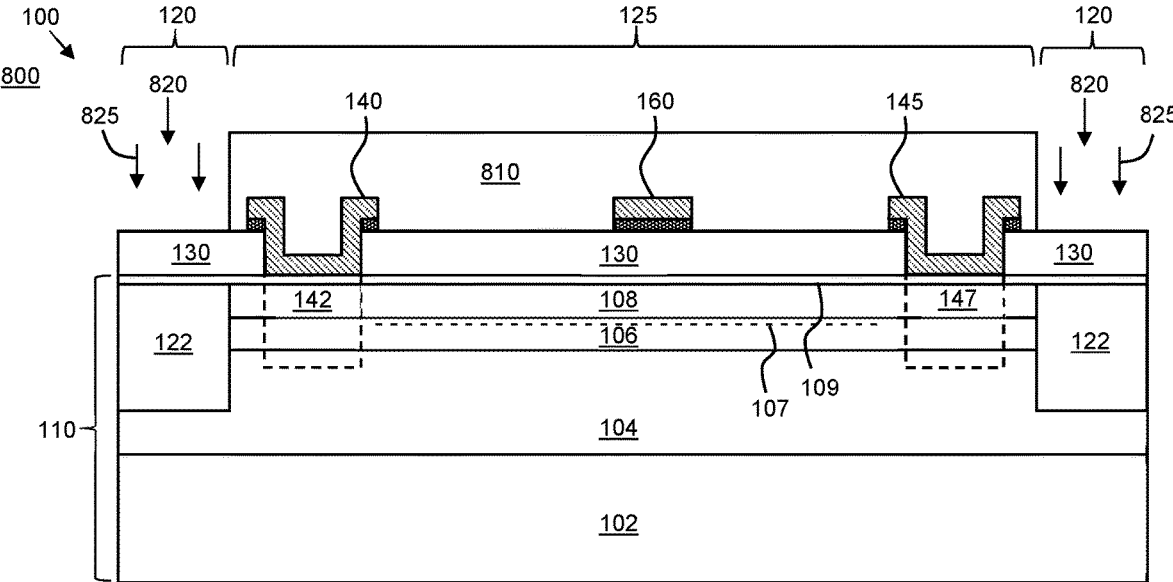

In block 214 of FIG. 2, and as depicted in fabrication stage 800 of FIG. 8, the method may continue by forming isolation regions 120. It should be noted that the isolation regions 120 alternatively may be formed at an earlier fabrication stage, in other embodiments. Forming the isolation regions 120 may include dispensing and patterning a resist mask 810 on or over the first dielectric layer 130, the source and drain electrodes 140, 145, and the field plate 160, and then defining openings 820 in the resist mask 810. Using ion implantation, a dopant species 825 (e.g., one or more of oxygen, nitrogen, boron, arsenic, helium, and/or argon) may be driven into the semiconductor substrate 110 to create high resistivity regions 122. In an embodiment, the energy and dose of the implant may be configured to create a sufficient amount of damage in the crystal structure of the semiconductor substrate 110 such that the semiconductor substrate is substantially high resistivity or semi-insulating within the high resistivity regions 122 of the isolation regions 120. In other embodiments (not shown), forming the isolation regions 120 may include, first, etching some or all of the semiconductor layers in the semiconductor substrate 110 and then ion implanting to enhance the resistivity in the remaining semiconductor layers and/or the host substrate 102. The resist mask 810 is removed before proceeding to the next fabrication stage.

Figure 9:
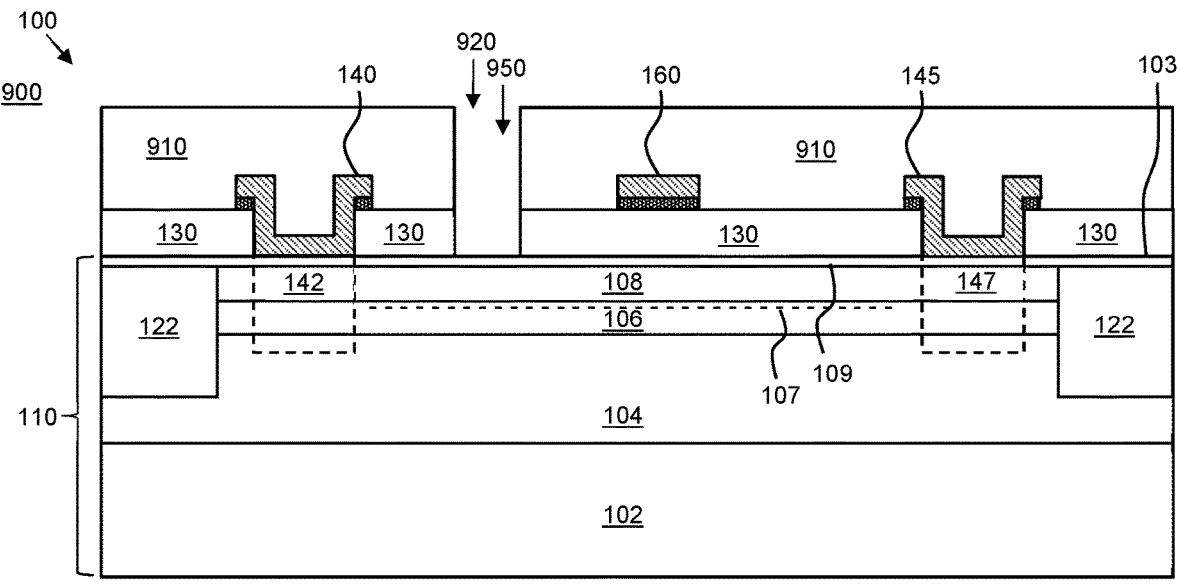

In block 216 of FIG. 2, and as depicted in fabrication stage 900 of FIG. 9, the method may continue by forming gate opening 950 through the first dielectric layer 130. This includes forming and patterning a photoresist layer 910 over the semiconductor substrate 110 (and more particularly on or over the first dielectric layer 130, the source and drain electrodes 140, 145, and the field plate 160). Once dispensed, the photoresist layer 910 is patterned to form resist opening 920 over the portion of the first dielectric layer 130 through which the gate opening 950 is to be formed.

In an embodiment, the gate opening 950 then may be created by etching through the first dielectric layer 130 in the area exposed by the resist openings 920, while stopping at the upper surface 103 of the base substrate 110. As discussed above in conjunction with block 208 and FIG. 5, etching the first dielectric layer 130 may include performing one or more dry etching processes, such as RIE, ICP etching, ECR etching, or another suitable dry etching process. In alternate embodiments, a suitable wet chemical etching process alternatively may be performed. The resist layer 910 may then be removed.

Figure 10:
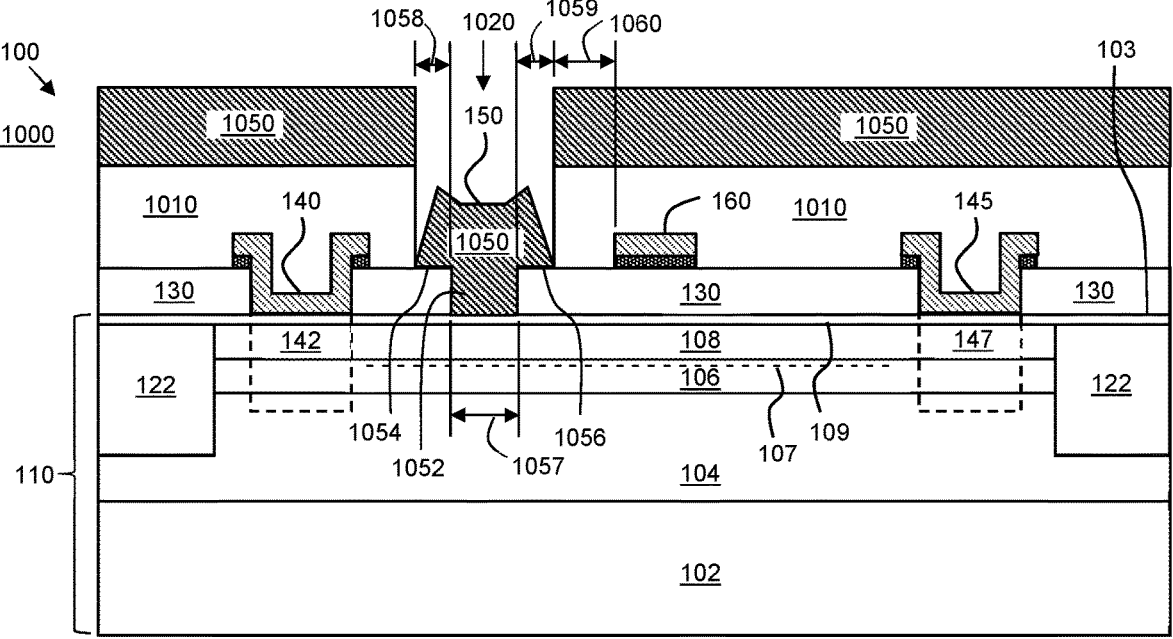

In block 218 of FIG. 2, and as depicted in fabrication stage 1000 of FIG. 10, the method may continue by forming the gate electrode 150. In an embodiment, the gate electrode 150 is formed on or over the semiconductor substrate 110 in the active region 125 between the source electrode 140 and the field plate 160.

According to one or more embodiments, a lift-off resist process may be used to form the gate electrode 150. More specifically, this may include forming and patterning a photoresist layer 1010 over the semiconductor substrate 110 (and more particularly on or over the first dielectric layer 130, the source and drain electrodes 140, 145, and the field plate 160). Once dispensed, the photoresist layer 1010 is patterned to form a gate electrode opening 1020 in the photoresist layer 1010 that encompasses the gate opening 950 and extends over portions of the first dielectric layer 130 beyond the gate opening 950 toward the source electrode 140 and the field plate 160. In FIG. 10, the distance between the right side of this opening 1020 and the field plate 160 defines the field plate-to-gate distance 1060 (i.e., the distance between the left edge of the field plate 160 and the right edge of the to-be-formed gate electrode 150). According to one or more embodiments, the field plate-to-gate distance 1060 may be between about 0.2 microns and about 1 micron. In other embodiments, the field plate-to-gate distance 1060 may be between about 0.1 microns and about 10 microns, though other suitable distances may be used.

Once photoresist layer 1010 is deposited and patterned, a gate metal layer 1050 is deposited over the photoresist layer 1010 and into the gate electrode opening 1020 (i.e., into the gate opening 950 and onto the exposed surfaces of the first dielectric layer 130 that are exposed through the gate electrode opening 1020). In one or more embodiments, the various layers of the gate metal layer 1050 may be deposited by evaporation, sputtering, PVD, ALD, or other suitable deposition technique(s).

According to various embodiments, the gate metal layer 1050 may include a metal stack of one or more Schottky material layers combined with one or more low stress conductive material layers. For example, a first layer within the multi-stack used to form the gate electrode 150 may include Ti, Ni, Pt, Cu, palladium (Pd), Cr, W, iridium (Ir), poly-silicon or other suitable materials. The first layer may be between about 30 and about 2,000 angstroms in thickness, although other thickness values may be used. One or more layers that act as conductive layers may be deposited on or over the first layer to form the gate electrode 150, according to an embodiment. The conductive layer(s) may include Au, Ag. Al, Cu, Ti or other substantially conductive materials. The conductive layer(s) may be between about 50 and about 20,000 angstroms in thickness, although other thickness values may be used. Optionally, one or more barrier metal layers may be placed between the first layer and the conductive layer(s), where the barrier metal layer(s) may include materials such as Ni, Pt, Cu, Pd, Cr, W, Ir or other substantially refractive materials that act as a barrier between the portion of the first layer that contacts the semiconductor substrate 110 and first dielectric layer 130 and the conductive layer(s). The barrier metal layer(s) may be between about 50 and about 10,000 angstroms in thickness, although other thickness values may be used.

It should be appreciated that other methods may be used to form the gate electrode 150 without departing from the scope of the inventive subject matter. For example, in other embodiments, the gate metal layer 1050 may be disposed over a gate dielectric (not shown) within the gate opening 950, such as SiO2, HfO2, Al2O3, or similar materials.

Once the gate metal layer 1050 is deposited, a lift-off process is then performed to remove the photoresist layer 1010 and the portions of the gate metal layer 1050 deposited on the photoresist layer 1010, while leaving the portion of the gate metal layer 1050 deposited into the gate electrode opening 1020 intact. In this manner, a low-loss, Schottky gate electrode 150 may be formed.

According to one or more embodiments, once formed, the gate electrode 150 may include a vertical stem 1052 that extends from the surface 103 of the substrate 110 up to and beyond the upper surface of the first dielectric layer 130, and first and second protruding regions 1054, 1056, which are coupled to the vertical stem 1052 and extend over portions of the upper surface of the first dielectric layer 130 toward the source and drain electrodes 140, 145, respectively. The gate electrode 150 may be characterized by a gate length 1057, and the first and second protruding regions 1054, 1056 may be characterized by lengths 1058 and 1059, respectively. In some embodiments, the gate length 1057 may be between about 0.1 microns and about 1 micron. In other embodiments, the gate length 1057 may be between about 0.02 microns and about 5 microns, though other suitable dimensions may be used. In some embodiments, the first protruding region length 1058 may be between about 0.1 microns and about 0.5 microns. In other embodiments, the first protruding region length 1058 may be between about 0.01 microns and 5 microns, though other suitable dimensions may be used. In some embodiments, the second protruding region length 1059 may be between about 0.1 microns and about 0.5 microns. In other embodiments, the second protruding region length 1059 may be between 0.1 microns and 2 microns, though other suitable lengths may be used.

In an alternate embodiment, rather than performing a lift-off resist process, the gate electrode 150 may be formed by depositing one or more layers of gate metal over the semiconductor substrate 110, and subsequently defining the gate electrode 150 by depositing and patterning photo resist over the gate metal, and then etching the gate metal to form the gate electrode 150 on or over the upper substrate surface 103 of the semiconductor substrate 110 within the gate opening 950, including extensions formed on or over the first dielectric layer 130.

Figure 11:
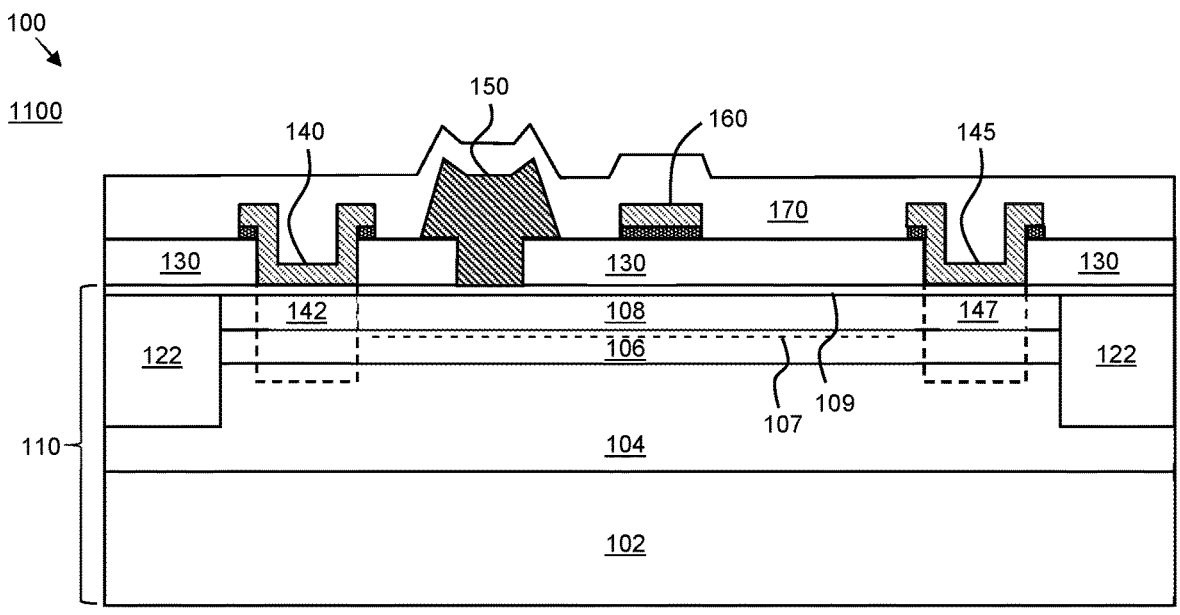

In block 220 of FIG. 2, and as depicted in fabrication stage 1100 of FIG. 11, the method may continue by forming a second dielectric layer 170 over the first dielectric layer 130, the source and drain electrodes 140, 145, the field plate 160, and the gate electrode 150. In one or more embodiments, the second dielectric layer 170 may include one or more layers of SiN, $Al_2O_3$, $SiO_2$, $HfO_2$, indium tin oxide (ITO), diamond, poly-diamond, AlN, boron nitride (BN), SiC, or a combination of these or other insulating materials. The total thickness of the layers used to form the second dielectric layer 170 may be between about 100 and about 10,000 angstroms in thickness, although other thickness values may be used. The second dielectric layer 170 may be deposited using LPCVD, ALD, sputtering, PVD, MBE, CVD (including PECVD, MOCVD, catalytic CVD, HWCVD, ICP CVD, and ECR CVD), a combination of these or other suitable dielectric deposition technique(s).

Figure 12:
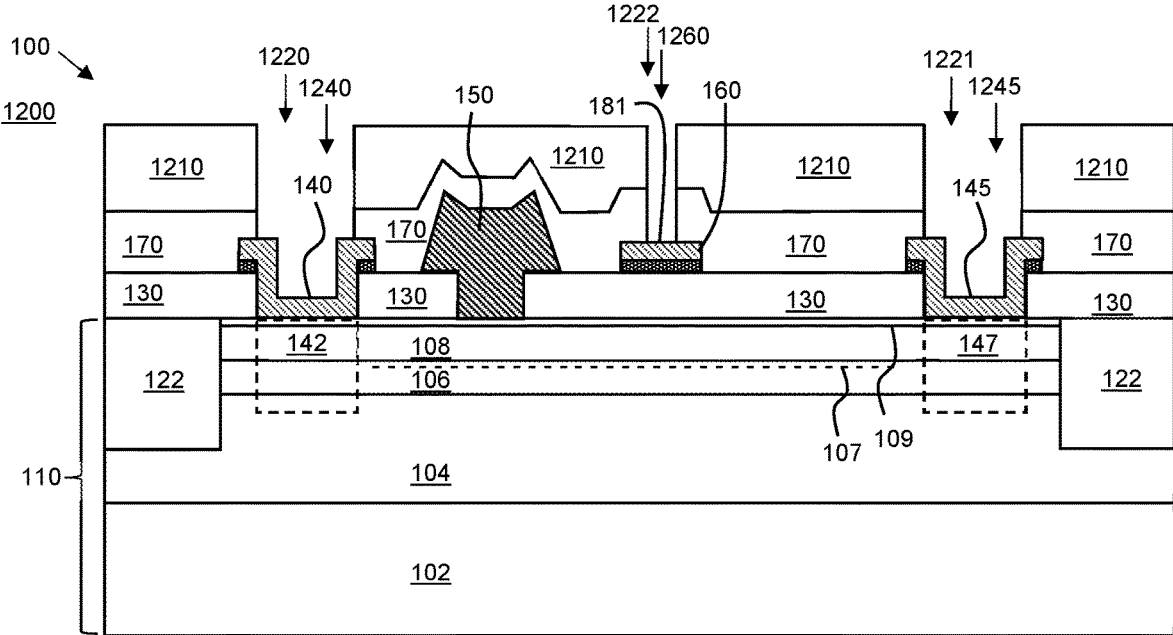

In block 222 of FIG. 2, and as depicted in fabrication stage 1200 of FIG. 12, the method may continue by forming and patterning a photoresist layer 1210 over the second dielectric layer 170. More specifically, once dispensed, the photoresist layer 1220 is patterned to form resist openings 1220, 1221, and 1222 over the source electrode 140, the drain electrode 145, and the field plate 160, respectively.

In an embodiment, a source contact opening 1240, a drain contact opening 1245, and one or more field plate openings 1260 then may be created by etching through the second dielectric layer 170 in areas exposed by the resist openings 1220-1222, while stopping at the upper surfaces of the source electrode 140, the drain electrode 145, and the field plate 160. The source and drain contact openings 1240, 1245 expose upper surfaces of the source and drain electrodes 140, 145, respectively. The one or more field plate openings 1260 expose one or more connection point(s) 181 along the length of the field plate 160 (i.e., the dimension extending along an axis perpendicular to the plane of GaN HFET device 100 shown in FIG. 1), according to various embodiments. In some embodiments, the field plate opening 1260 is a single continuous opening along the entire length of the field plate 160, and thus the field plate opening 1260 exposes a single elongated connection point 181. In other embodiments, multiple field plate openings 1260, which are spatially-separated by portions of the second dielectric layer 170, may be formed in multiple distinct regions along the field plate length. In such embodiments, a connection-to-connection distance between adjacent connection points 181 along the field plate 160 may be a fixed value of between about 5 microns and about 500 microns, although other shorter or longer values for the connection-to-connection distance may be used.

Etching the second dielectric layer 170 preferably includes performing one or more dry etching processes, such as RIE, ICP etching, ECR etching, or another suitable dry etching process. In alternate embodiments, a suitable wet chemical etching process alternatively may be performed. According to one or more embodiments, suitable dry etching techniques may use one or more of $SF_6$, $C_2F_6$, $CF_4$, $CHF_3$ or other chemistries. The patterned photoresist layer 1210 is removed before proceeding to the next fabrication stage.

Figure 13:
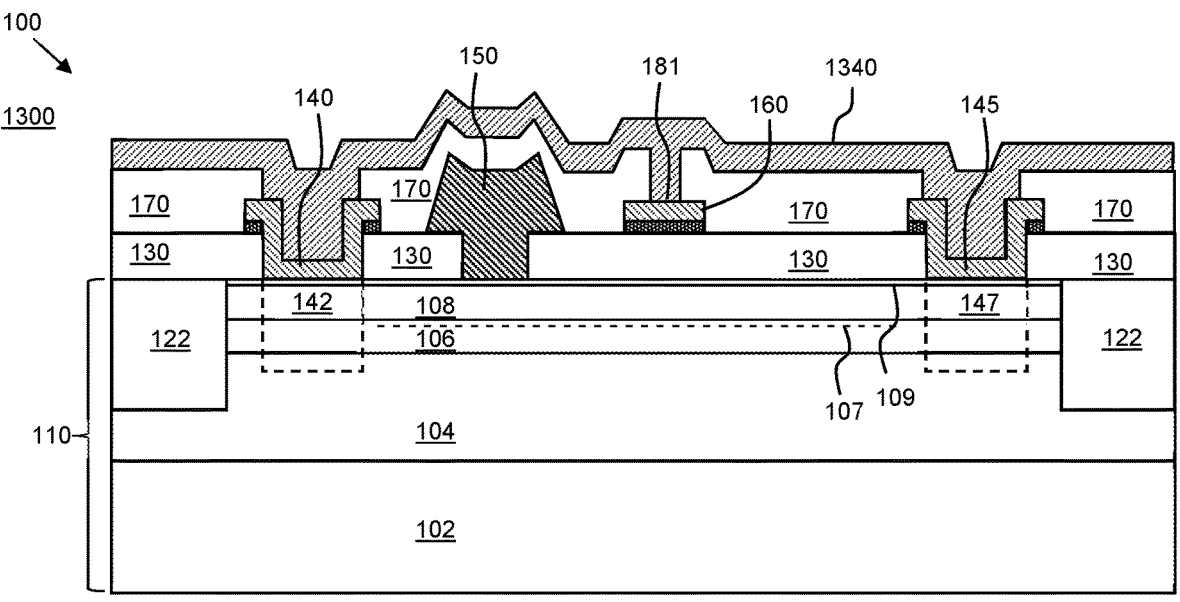

In block 224 of FIG. 2, and as depicted in fabrication stage 1300 of FIG. 13, the method may continue by depositing a second conductive layer 1340 on or over the second dielectric layer 170 and exposed portions of the source and drain regions 142, 147 and the field plate 160. The second conductive layer 1340 may correspond, for example, to the lowest metal interconnect layer (M0) of the device 100.

According to an embodiment, the second conductive layer 1340 is blanket deposited over the upper surface of the second dielectric layer 170, and over portions of the source electrode 140, the drain electrode 145, and the field plate 160 that are exposed through the openings 1240, 1245, and 1260 in the second dielectric layer 170. In one or more embodiments, the second conductive layer 1340 may be deposited by sputtering, evaporation, PVD, or other suitable deposition techniques. In one or more embodiments, the second conductive layer 1340 may contain one or more materials selected from Ti, Al, TiN, TiW, TiAl, and/or TiWN, Au, Mo, Ni, Si, Ge, Pt, Ta, Cu, Au, Ag, and/or other suitable materials.

Figure 14:
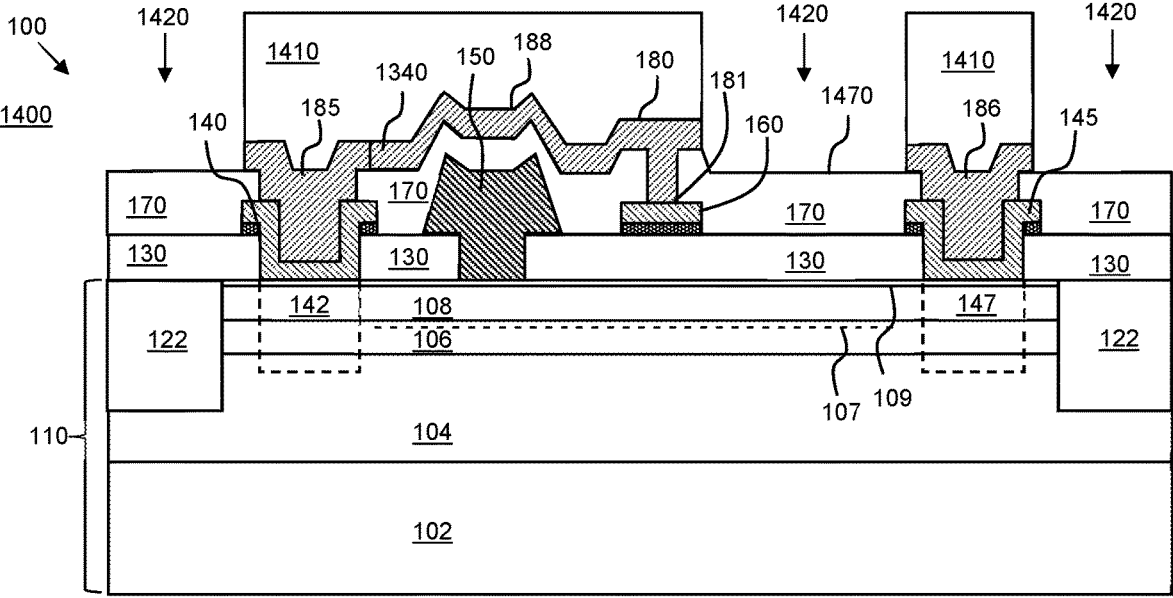

In block 226 of FIG. 2, and as depicted in fabrication stages 1400 of FIG. 14, the method may continue by patterning the second conductive layer 1340 to form source metallization 185, drain metallization 186, and a conductive connection 180 between the field plate 160 and the source metallization 185 (i.e., between the field plate 160 and the source region 142).

The method may continue by forming and patterning a photoresist layer 1410 over the second conductive layer 1340. More specifically, once dispensed, the photoresist layer 1410 is patterned to form resist openings 1420 over portions of the second conductive layer 1340 outside of the desired locations of the source and drain metallization 185, 186 and the conductive connection 180. Said another way, the photoresist layer 1410 is patterned to protect portions of the second conductive layer 1340 over the source and drain electrodes 140, 145, over the field plate 160, and between the field plate 160 and the source electrode 140.

Portions of layers the second conductive layer 1340 that are exposed through openings 1420 in the photoresist layer 1410 are then removed by etching through the second conductive layer 1340 in areas exposed by the resist openings 1420, while stopping at the upper surface 1470 of the second dielectric layer 170. Etching the second conductive layer 1340 preferably includes performing a dry etching process, such as RIE, ICP etching, ECR etching, or other suitable dry etching processes. For example, suitable dry etching techniques may use one or more of $SF_6$, $C_2F_6$, $CF_4$, $CHF_3$ or other chemistries like BCl3/Cl2, according to an embodiment. In an alternate embodiment, a suitable wet chemical etching process may be performed.

The etching process results in the formation of the source and drain metallization 185, 186 and the conductive connection 180 between the field plate 160 and the source metallization 185. As mentioned previously, in some embodiments, the field plate source connection 180 includes conductive straps 188, which include relatively-thin conductors spaced along the transistor finger that extend, periodically, over the gate electrode 150 to electrically couple multiple connection points 181 along the field plate 160 to the source electrode 140. In other embodiments, rather than including conductive straps 188, the field plate source connection 180 may include a solid, continuous conductive structure between the field plate 160 and the source electrode 140. The patterned photoresist layer 1410 is removed, resulting in semiconductor device 100 depicted in FIG. 1.

In block 228 of FIG. 2, and as depicted in FIG. 1, fabrication of device 100 may then be completed by forming additional dielectric layers and conductive layers (e.g., M1, M2, etc.) over the second conductive layer 170 to provide selective electrical connections between the device 100 and other features of the semiconductor device 100 (e.g., input/output bondpads, other transistor fingers, and so on). The method of FIG. 2 may then end.

An embodiment of a semiconductor device includes a semiconductor substrate comprising an upper surface and a channel, a first dielectric layer disposed over the upper surface of the semiconductor substrate, and a diffusion barrier layer disposed over the first dielectric layer. The diffusion barrier layer is patterned to include multiple segments, including at least a first segment and a second segment. A gate electrode is formed over the semiconductor substrate, and the gate electrode extends through the first dielectric layer and is electrically coupled to the channel. The semiconductor device further includes a drain opening that extends through the first dielectric layer, and the drain opening is spatially separated from a first side of the gate electrode. A drain electrode is electrically coupled to the channel, and the drain electrode includes a first portion formed within the drain opening, and a second portion that overlies the second segment of the multiple segments of the diffusion barrier layer. The semiconductor device also includes a conductive field plate between the gate electrode and the drain electrode. The conductive field plate includes the first segment of the multiple segments of the diffusion barrier layer.

According to a further embodiment, the conductive field plate includes a field plate layer and the first segment of the diffusion barrier layer. The drain electrode and the field plate layer are formed from portions of a first conductive layer. According to another further embodiment, sidewalls of the field plate layer are coplanar with sidewalls of the first segment of the multiple segments of the diffusion barrier layer. According to yet another further embodiment, a sidewall of the second portion of the drain electrode is coplanar with a sidewall of the second segment of the multiple segments of the diffusion barrier layer. According to yet another further embodiment, the semiconductor device further includes a source electrode that includes a portion that overlies a third segment of the multiple segments of the diffusion barrier layer. According to yet another further embodiment, the drain electrode, the source electrode, and the field plate layer are formed from portions of a first conductive layer. According to yet another further embodiment, the diffusion barrier layer is formed from one or more refractory metals, including one or more materials selected from tungsten (W), molybdenum (Mo), and titanium nitride (TiN).

An embodiment of a gallium nitride field effect transistor device includes a semiconductor substrate, comprising gallium nitride and further comprising an upper surface and a channel. The device further includes a first dielectric layer disposed over the upper surface of the semiconductor substrate, and a diffusion barrier layer disposed over the first dielectric layer and patterned to include first, second, and third segments. The device further includes a gate electrode formed over the semiconductor substrate, where the gate electrode extends through the first dielectric layer and is electrically coupled to the channel. A drain opening extends through the first dielectric layer, and the drain opening is spatially separated from a first side of the gate electrode. A drain electrode is electrically coupled to the channel, and the drain electrode includes a first portion formed within the drain opening, and a second portion that overlies the second segment of the multiple segments of the diffusion barrier layer. The device further includes a conductive field plate between the gate electrode and the drain electrode, and the conductive field plate includes the first segment of the multiple segments of the diffusion barrier layer. A source opening extends through the first dielectric layer, and the source opening is spatially separated from a second side of the gate electrode. A source electrode is electrically coupled to the channel, and the source electrode includes a first portion formed within the source opening, and a second portion that overlies the third segment of the multiple segments of the diffusion barrier layer.

According to a further embodiment, the drain electrode, the source electrode, and the field plate layer are formed from portions of a first conductive layer. According to another further embodiment, a sidewall of the second portion of the drain electrode is coplanar with a sidewall of the second segment of the multiple segments of the diffusion barrier layer, sidewalls of the field plate layer are coplanar with sidewalls of the first segment of the multiple segments of the diffusion barrier layer, and a sidewall of the second portion of the source electrode is coplanar with a sidewall of the third segment of the multiple segments of the diffusion barrier layer.

An embodiment of a method for forming a semiconductor device includes forming a first dielectric layer over an upper surface of a semiconductor substrate that includes a channel, and forming a diffusion barrier layer over the first dielectric layer. The method further includes forming a drain opening through the diffusion barrier layer and through the first dielectric layer, depositing a first conductive layer over the diffusion barrier layer and into the drain opening, and patterning the first conductive layer and the diffusion barrier layer to form a field plate and a drain electrode that is spatially separated from a first side of the field plate. The field plate includes a first portion of the first conductive layer and a first segment of the diffusion barrier layer, and the drain electrode includes a second portion of the first conductive layer within the drain opening that is electrically coupled to the channel, and a third portion of the first conductive layer that overlies a second segment of the diffusion barrier layer. The method further includes forming a gate electrode over the semiconductor substrate that is spatially separated from a second side of the field plate. The gate electrode extends through the first dielectric layer and is electrically coupled to the channel.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

For the sake of brevity, conventional semiconductor fabrication techniques may not be described in detail herein. In addition, certain terminology may also be used herein for reference only, and thus are not intended to be limiting, and the terms "first," "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

What is claimed is:

1. A semiconductor device comprising:
a semiconductor substrate comprising an upper surface and a channel;
a first dielectric layer disposed over the upper surface of the semiconductor substrate;
a diffusion barrier layer disposed on and above an upper surface of the first dielectric layer, wherein the diffusion barrier layer is patterned to include multiple segments, including at least a first segment and a second segment;
a gate electrode formed over the semiconductor substrate, wherein the gate electrode extends through the first dielectric layer and is electrically coupled to the channel;
a drain opening that extends through the first dielectric layer, wherein the drain opening is spatially separated from a first side of the gate electrode;

a drain electrode electrically coupled to the channel, wherein the drain electrode includes a first portion formed within the drain opening, and a second portion that overlies the second segment of the multiple segments of the diffusion barrier layer; and
a conductive field plate between the gate electrode and the drain electrode, wherein the conductive field plate includes the first segment of the multiple segments of the diffusion barrier layer.

2. The semiconductor device of claim 1, wherein:
the conductive field plate includes the first segment of the diffusion barrier layer, and a field plate layer on the first segment; and
the drain electrode and the field plate layer are formed from portions of a first conductive layer.

3. The semiconductor device of claim 1, wherein:
sidewalls of the field plate layer are coplanar with sidewalls of the first segment of the multiple segments of the diffusion barrier layer.

4. The semiconductor device of claim 1, wherein:
a sidewall of the second portion of the drain electrode is coplanar with a sidewall of the second segment of the multiple segments of the diffusion barrier layer.

5. The semiconductor device of claim 1, further comprising:
a source opening that extends through the first dielectric layer, wherein the source opening is spatially separated from a second side of the gate electrode; and
a source electrode electrically coupled to the channel, wherein the source electrode includes a first portion formed within the source opening.

6. The semiconductor device of claim 5, wherein:
the source electrode further includes a second portion that overlies a third segment of the multiple segments of the diffusion barrier layer.

7. The semiconductor device of claim 6, wherein:
a sidewall of the second portion of the source electrode is coplanar with a sidewall of the third segment of the multiple segments of the diffusion barrier layer.

8. The semiconductor device of claim 5, further comprising:
a second dielectric layer disposed over the first dielectric layer; and
a connection that extends over a portion of the second dielectric layer and over the gate electrode to electrically connect the field plate to the source electrode.

9. The semiconductor device of claim 5, wherein:
the conductive field plate includes the first segment of the diffusion barrier layer, and a field plate layer on the first segment; and
the drain electrode, the source electrode, and the field plate layer are formed from portions of a first conductive layer.

10. The semiconductor device of claim 5, wherein:
the gate electrode includes a vertical stem within a gate opening through the first dielectric layer, and first and second protruding regions, which are coupled to the vertical stem and extend over portions of the first dielectric layer toward the source and drain electrodes.

11. The semiconductor device of claim 1, wherein:
the first dielectric layer is on the upper surface of the semiconductor substrate;
the diffusion barrier layer is on the first dielectric layer; and
the conductive field plate includes a field plate layer on the first segment.

12. The semiconductor device of claim 1, wherein:

the diffusion barrier layer is formed from one or more refractory metals, including one or more materials selected from tungsten (W), molybdenum (Mo), and titanium nitride (TiN).

13. The semiconductor device of claim 1, wherein:

the first dielectric layer is formed from one or more dielectric materials, including one or more materials selected from silicon dioxide ($SiO_2$), silicon nitride (SiN), silicon oxynitride (SiON), aluminum oxide ($Al_2O_3$), aluminum nitride (AlN), and hafnium oxide ($HfO_2$).

14. A gallium nitride field effect transistor device comprising:

a semiconductor substrate, comprising gallium nitride and further comprising an upper surface and a channel;

a first dielectric layer disposed over the upper surface of the semiconductor substrate;

a diffusion barrier layer disposed on and above an upper surface of the first dielectric layer, wherein the diffusion barrier layer is patterned to include first, second, and third segments;

a gate electrode formed over the semiconductor substrate, wherein the gate electrode extends through the first dielectric layer and is electrically coupled to the channel;

a drain opening that extends through the first dielectric layer, wherein the drain opening is spatially separated from a first side of the gate electrode;

a drain electrode electrically coupled to the channel, wherein the drain electrode includes a first portion formed within the drain opening, and a second portion that overlies the second segment of the multiple segments of the diffusion barrier layer;

a conductive field plate between the gate electrode and the drain electrode, wherein the conductive field plate includes the first segment of the multiple segments of the diffusion barrier layer;

a source opening that extends through the first dielectric layer, wherein the source opening is spatially separated from a second side of the gate electrode; and a source electrode electrically coupled to the channel, wherein the source electrode includes a first portion formed within the source opening, and a second portion that overlies the third segment of the multiple segments of the diffusion barrier layer.

15. The gallium nitride field effect transistor device of claim 14, wherein:

the conductive field plate includes the first segment of the diffusion barrier layer, and a field plate layer on the first segment; and the drain electrode, the source electrode, and the field plate layer are formed from portions of a first conductive layer.

16. The gallium nitride field effect transistor device of claim 14, wherein:

a sidewall of the second portion of the drain electrode is coplanar with a sidewall of the second segment of the multiple segments of the diffusion barrier layer;

sidewalls of the conductive field plate are coplanar with sidewalls of the first segment of the multiple segments of the diffusion barrier layer; and a sidewall of the second portion of the source electrode is coplanar with a sidewall of the third segment of the multiple segments of the diffusion barrier layer.

17. A method for forming a semiconductor device, the method comprising:

forming a first dielectric layer over an upper surface of a semiconductor substrate that includes a channel;

forming a diffusion barrier layer on and above an upper surface of the first dielectric layer;

forming a drain opening through the diffusion barrier layer and through the first dielectric layer;

depositing a first conductive layer over the diffusion barrier layer and into the drain opening;

patterning the first conductive layer and the diffusion barrier layer to form a field plate and a drain electrode that is spatially separated from a first side of the field plate, wherein:

the field plate includes a first portion of the first conductive layer and a first segment of the diffusion barrier layer, and the drain electrode includes a second portion of the first conductive layer within the drain opening that is electrically coupled to the channel, and a third portion of the first conductive layer that overlies a second segment of the diffusion barrier layer; and forming a gate electrode over the semiconductor substrate that is spatially separated from a second side of the field plate, wherein the gate electrode extends through the first dielectric layer and is electrically coupled to the channel.

18. The method of claim 17, wherein:

the diffusion barrier layer is formed from a material selected one or more refractory metals, including one or more materials selected from tungsten (W), molybdenum (Mo), and titanium nitride (TiN).

19. The method of claim 17, further comprising:

after depositing the first conductive layer and before patterning the first conductive layer and the diffusion barrier layer, performing a high temperature annealing process.

20. The method of claim 17, wherein:

patterning the first conductive layer and the diffusion barrier layer includes performing an etching process to etch through the first conductive layer; and upon completion of the etching process, sidewalls of the first portion of the first conductive layer are coplanar with sidewalls of the first segment of the diffusion barrier layer, and a sidewall of the third portion of the first conductive layer is coplanar with a sidewall of the second segment of the diffusion barrier layer.

21. The method of claim 17, further comprising:

forming a source opening through the diffusion barrier layer and through the first dielectric layer;

wherein depositing the first conductive layer includes depositing the first conductive layer into the source opening;

wherein patterning the first conductive layer and the diffusion barrier layer results in formation of a source electrode, wherein the source electrode includes a fourth portion of the first conductive layer within the source opening that is electrically coupled to the channel, and a fifth portion of the first conductive layer that overlies a third segment of the diffusion barrier layer; and wherein the method further comprises forming a conductive connection between the field plate and the source electrode.

* * * * *